United States Patent [19]
Handford et al.

[11] Patent Number: 5,153,408
[45] Date of Patent: Oct. 6, 1992

[54] NOVEL METHOD AND STRUCTURE FOR REPAIRING ELECTRICAL LINES

[75] Inventors: Edward F. Handford, Wurtsboro; Joseph M. Harvilchuck, Billings; Mario J. Interrante, New Paltz; Raymond A. Jackson, Wappingers Falls; Raj N. Master, Wappingers Falls; Sudipta K. Ray, Wappingers Falls; William E. Sablinski, Beacon; Thomas A. Wassick, Wappingers Falls, all of N.Y.

[73] Assignee: International Business Machines Corporation, Armonk, N.Y.

[21] Appl. No.: 607,969

[22] Filed: Oct. 31, 1990

[51] Int. Cl.$^5$ .............................. B23K 26/00
[52] U.S. Cl. .................... 219/121.64; 219/121.66; 219/121.85; 338/195
[58] Field of Search ............ 219/121.63, 121.64, 219/121.84, 121.85, 121.65, 121.66; 338/195

[56] References Cited

U.S. PATENT DOCUMENTS

| | | | |
|---|---|---|---|
| 3,406,246 | 10/1968 | Davidson et al. | 174/68.5 |
| 3,762,040 | 10/1973 | Burns et al. | 29/593 |
| 4,259,367 | 3/1981 | Dougherty, Jr. | 427/96 |
| 4,417,392 | 11/1983 | Ibrahim et al. | 29/840 |
| 4,418,264 | 11/1983 | Thorwarth | 219/78.01 |
| 4,489,364 | 12/1984 | Chance | 361/395 |
| 4,546,413 | 10/1985 | Feinberg et al. | 361/410 |
| 4,562,092 | 12/1985 | Wiech | 427/58 |
| 4,572,941 | 2/1986 | Sciaky et al. | 219/121 LD |
| 4,588,468 | 5/1986 | McGinty et al. | 156/345 |
| 4,630,355 | 12/1986 | Johnson | 29/575 |
| 4,675,717 | 6/1987 | Herrero et al. | 357/71 |
| 4,683,652 | 8/1987 | Harfield | 29/829 |
| 4,691,426 | 9/1987 | Roucek et al. | 29/402.18 |
| 4,694,138 | 9/1987 | Oodaira et al. | 219/121.85 |
| 4,704,304 | 11/1987 | Amendola et al. | 427/57 |
| 4,714,815 | 12/1987 | Swarts et al. | 219/121 LC |
| 4,739,389 | 4/1988 | Goedbloed | 357/75 |
| 4,797,530 | 1/1989 | Iwase | 219/121.85 |
| 4,880,959 | 11/1989 | Baum et al. | 219/121.85 |

FOREIGN PATENT DOCUMENTS 2067845 7/1981 United Kingdom.

OTHER PUBLICATIONS

S. Mutnick, "Repairing Breaks in Printed Circuits", IBM Technical Disclosure Bulletin, vol. 8, No. 11, p. 1469 (Apr. 1966).
A. D. Jones, et al., "Solder Coating Thin Copper Wire", IBM Technical Disclosure Bulletin, vol. 11, No. 7, p. 876 (Dec. 1968).
D. E. Hobbs, et al., "Solder Coating Thin Copper Wire", IBM Technical Disclosure Bulletin, vol. 12, No. 2, p. 361 (Jul. 1969).
F. M. Tappen, "Open Conductor Repair for Glass Metal Module", *IBM Technical Disclosure Bulletin*, vol. 14, No. 10, p. 2915 (Mar. 1972).

(List continued on next page.)

*Primary Examiner*—C. L. Albritton
*Attorney, Agent, or Firm*—Azia M. Ahsan

[57] ABSTRACT

The present invention relates generally to a new method of repairing electrical lines, and more praticularly to repairing electrical lines having an open at the module level with devices in place. Various methods and processes are used to repair this open or defective portion in an electrical conductor line. It could be repaired by securing a jumper wire or nugget across the open or the repair could be made by a deposition process, which includes but is not limited to filling the open with a solder type material or inserting a solder coated electrical wire and heating the solder and allowing the solder to melt and repair the open. One of the attributes of this invention is the ability to repair on a substrate or module on which active components such as chips, and passive components such as pins, capacitors, etc. have been attached. The invention also allows repair of fine line patterns which are normally not repairable by conventional techniques.

44 Claims, 2 Drawing Sheets

OTHER PUBLICATIONS

R. E. Mackey, et al., "Conductive Line Jumper/Repair Connection in Glass Metal Module", *IBM Technical Disclosure Bulletin,* vol. 15, No. 8, p. 2423 (Jan. 1973).

J. L. DeMarco, et al., "Process for Forming Jumpers", *IBM Technical Disclosure Bulletin,* vol. 22, No. 6, p. 2259 (Nov. 1979).

P. Bakos, et al., "Circuit Repair/Work of Metallized Polyimide Substrates", *IBM Technical Disclosure Bulletin,* vol. 22, No. 9, pp. 3986–3987 (Feb. 1980).

J. A. Brunner, et al., "Laser Repair of Screened Metallurgy", *IBM Technical Disclosure Bulletin,* vol. 22, No. 12, p. 5319 (May 1980).

P. Bakos, et al., "Protecting Repair Wires on Printed Circuit Boards", *IBM Technical Disclosure Bulletin,* vol. 24, No. 2, p. 1242 (Jul. 1981).

C. J. Anderson, et al., "Josephson Package Repair", *IBM Technical Disclosure Bulletin,* vol. 26, No. 12, pp. 6244–6245 (May 1984).

F. Gobran, "Tailless Thermo-Compression Bonding", *IBM Technical Disclosure Bulletin,* vol. 27, No. 5, p. 3041 (Oct. 1984).

"Laser Ablative Cleaning of Bonding Surfaces", *IBM Technical Disclosure Bulletin,* vol. 32, No. 4A, pp. 429–430 (Sep. 1989).

T. H. Baum, "Laser Chemical Vapor Deposition of Gold—The Effect of Organometallic Structure", Jrl. of the Electrochemical Soc.:Solid State Science and Technology, vol. 134, No. 10, pp. 2616–2619, (Oct. 1987).

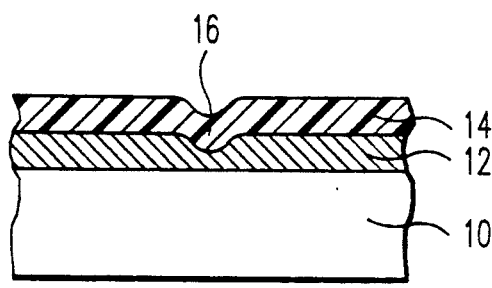
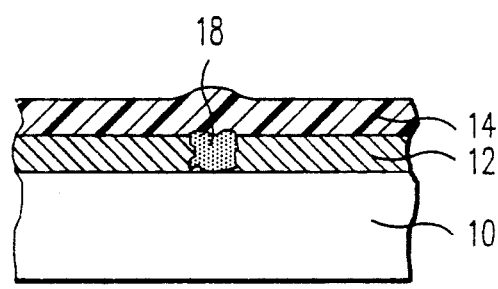
FIG. 1A  FIG. 1B
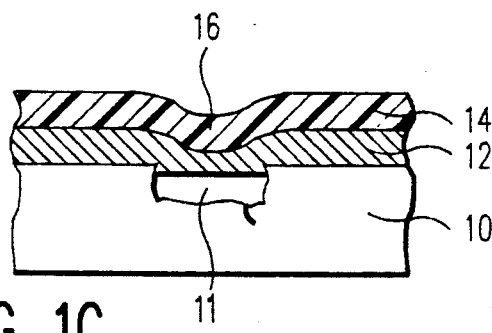
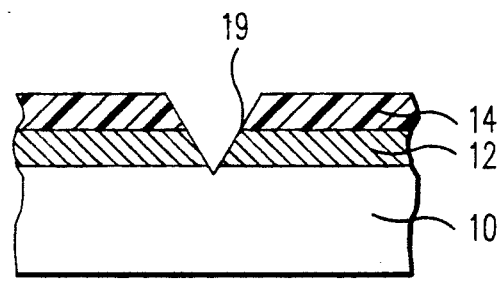
FIG. 1C  FIG. 1D
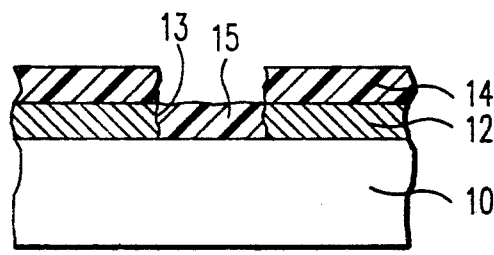
FIG. 1E
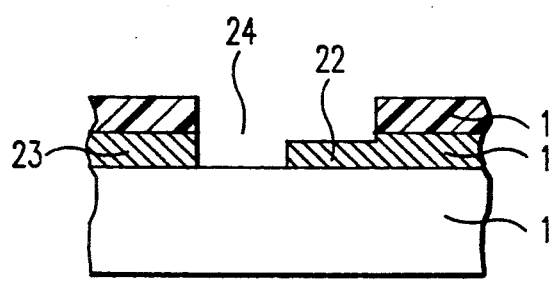
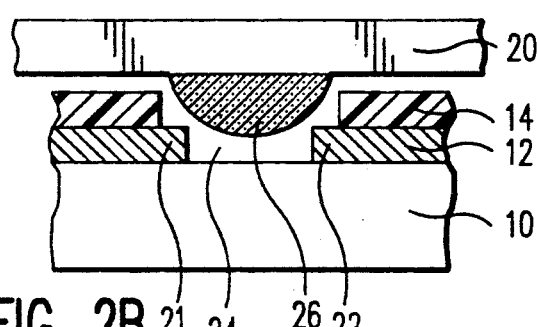
FIG. 2A  FIG. 2B
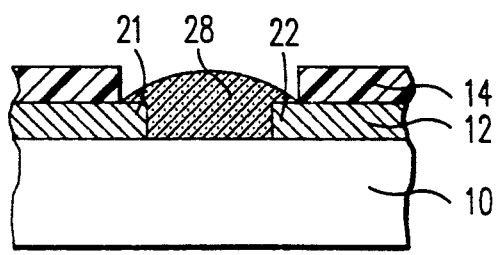
FIG. 2C

NOVEL METHOD AND STRUCTURE FOR REPAIRING ELECTRICAL LINES

FIELD OF THE INVENTION

The present invention relates generally to a new method of repairing electrical lines, and more particularly to repairing electrical lines having an open. Various methods and processes are used to repair this open or defective portion in the electrical conductor line. The repair could be made by a deposition process, which includes but is not limited to filling the open with a solder type material or inserting a solder coated electrical wire and heating the solder and allowing the solder to melt and repair the open. The line could also be repaired by securing a jumper wire across the open or by securing a wire nugget to the two ends of the open.

BACKGROUND OF THE INVENTION

With the advent of modern day electronics, the circuits on a PCB (Printed Circuit Board) or modules or chips have become more and more dense. As a result the electrical lines or conductor lines are thinner and narrower so that more of them can be placed in a given area. Therefore, the probability of the conductor lines having defects increases and each of the electronic line carriers has to be inspected for faults in the conductor lines. This inspection can be done visually (manually) or automatically, or the lines can also be electrically verified. Once a fault or defect is found, then it has to be located and repaired. Most of the methods presently under use require that the fault or defect be visually located by the operator, and then using a microscope the defective conductor line is repaired manually.

The testing and repairing of the conductor lines are among the most critical steps in the packaging technology. This is because the electronic hardware must be reliable and free from defects, as they are very expensive to manufacture and the field failures cannot be repaired easily. In addition, due to the large size of the package (tens of millimeters), which supports a large area interconnection between silicon or other devices, it is not practical to isolate and throw away the defective part of the package, as is commonly done in the manufacture of silicon chips. To eliminate these immediate and potential defects, tremendous efforts are being made.

The most commonly found defects are open, or cracks in lines, or shorts between lines. Most defects or faults in a conductor line are due to masking or improper deposition of the conductive material. But they could also be related to other factors, such as impure material or stretching the resolution limits of the lithography process. The thin film redistribution lines may have opens due to contamination, process mishaps and physical damage.

Another reason for opens is due to stresses generated during thermal cycles in bond and test process used during assembly of PCB or ceramic modules. The thin film lines with cracks and other latent defects may also develop opens. These opens must be repaired in order to use the substrate or module or package which is otherwise electrically good.

Particularly, in the thin film processing, the thin film redistribution and other interconnection lines are susceptible to defects which could result in the lines being electrically open. Defects could include voids, missing metal, various particle contamination or physical damage. A redundant metal scheme helps to substantially reduce the number of defective lines, but this scheme does not eliminate them entirely. Those lines identified as "open" after thin film electrical test can be repaired by processes such as laser CVD (Chemical Vapor Deposition) prior to a polyimide overcoat process. Occasionally an "open" line will go undetected through test or becomes "open" during subsequent thermal processing. These defective conductors appear in the module or substrate, after pins, capacitors and chips are joined. If an "open" line should be found at this point, it is essential to repair the defect so that the module or the substrate or the package can be used.

Recently non-destructive electrical testing methods (for example, NLC (Nonlinear Conductivity) tester as disclosed in U.S. Pat. No. 4,496,900) have been developed. The NLC tester locates the lines with current constricting defects, such as, cracks, line breaks, intermittent opens, narrow necks, etc. The method of high pulse current, as discussed elsewhere, can then be used to open up the defects. This process is utilized due to the fact that it is easier to visually locate the complete opens than latent defects.

It is disclosed in, "Repairing Breaks in Printed Circuits," IBM Technical Disclosure Bulletin, Vol. 8, No. 11, Page 1469 (April 1966), that small breaks in a line can be repaired by filling the gap in the broken line with a material that is cured at room temperature or higher to form a base conductive material. A conductive metal layer is then electroplated over the base conductive material to complete the repair. Using this process would require that lines to be repaired, on extremely dense packages with chips, capacitors and discrete wires in place, be isolated during electroplating. This would create significant handling and tooling problem.

"Open Conductor Repair For Glass Metal Module," IBM Technical Disclosure Bulletin, Vol. 14, No. 10, Page 2915 (March 1972), discloses another method of making open repairs. Here a metal line to be transferred is aligned over the open or break, and using a laser beam, a portion of the metal layer is welded to each end of the broken line. This article also teaches that the line could be reflowed into the break using a laser or it could be evaporated into the break. Each of these features cannot be used with the present invention, because melting of high temperature conductive metals, such as copper, is used. Energy required to melt such lines by laser would damage polyimide adjacent to the lines to be repaired.

A rather complex process for repairs of opens is disclosed in U.S. Pat. No. 4,259,367 (Dougherty, Jr.), where a conductor patch line is interconnected onto a good line through an insulating layer. This requires the addition of new wiring layers with photolithographic techniques which would be incompatible with a substrate with components already in place.

Another method of repairing opens is by decal transfer as disclosed in U.S. Pat. No. 4,704,304 (Amendola, et al.), and presently assigned to IBM Corporation.

Another method of electric circuit line repairs is taught in U.S. Pat. No. 4,630,355 (Johnson). A layer of phase-change material is deposited prior to the deposition of the conductive line and in case an open results in the conductive line, a current is passed so that a portion of the phase-change material becomes electrically conductive and makes an electrical bridge across the gap or open. This method is not suitable for repairs on polyimide films due to lack of adhesion of such phase-change materials to polyimide.

In U.S. Pat. No. 4,418,264 (Thorwarth), a specifically shaped metallic part is placed on the conductor path interruption and by means of micro-resistance welding, the metallic part is welded to the conductor to bridge the interruption. Welding involves melting of the repair material which when used on current "state of the art" thin film polymer packages could cause structural damage to the polymer. Welding also requires the passage of drive currents which would be incompatible with this invention as there are active devices which are connected to the lines being repaired at different locations.

Another method of repairing opens and narrow necks has been disclosed in U.S. Pat. No. 4,919,971 (Chen). The defective site in the conductor line having a thin portion or a narrow neck does not have to be physically located to initiate the repairs. The process of this invention is self-induced, i.e., the passage of the drive current creates a hot spot at the defective site and conductive material is induced to be deposited at the defective site. The process of this invention is also self-limiting, i.e., when the defect has been repaired, the process will slow down and stop by itself. This technique requires the substrate to be immersed in a plating bath or be exposed to organometallic vapors which would make it incompatible with line repair processes where the active and passive components have already been mounted on the substrate.

"Conductive Line Jumper/Repair Connection in Glass Metal Module," IBM Technical Disclosure Bulletin, Vol. 15, No. 8, Page 2423 (January 1973), discloses another method of making open repairs. Here after the open has been located, a wire is placed across the open line and the wire is welded to each end of the open line. After welding the repaired plane is glassed over leaving a surface suitable for developing another circuit layer. This process teaches the repairs of the carrier at the build level, and not at the functional module level. This process also requires the use of high melting point metals and a subsequent sintering of inorganic materials.

Another welding process for repairing of opens is discussed in, "Circuit Repair/Work of Metallized Polyimide Substrates," IBM Technical Disclosure Bulletin, Vol. 22, No. 9, Page 3986 (February 1980). A piece of wire is jumpered across the open and both ends of the jumpered wire are welded to the circuit line, thus yielding a "continuous electrical line." This process also discloses the use of gold wire for making the repair.

Another method of making circuit repairs is disclosed in, "Tailless Thermo-Compression Bonding," IBM Technical Disclosure Bulletin, Vol. 27, No. 5, Page 3041 (October 1984), where the circuit line is repaired by passing an electric current between two electrodes which fuse the circuit line and the repair material together.

"Josephson Package Repair," IBM Technical Disclosure Bulletin, Vol. 26, No. 12, Pages 6244-6245 (May 1984), is another example of making repairs. The faulty circuits are cut out by laser scribing, and the repair of an open is done by cutting the bad line next to the pad and using a third wiring level to reconnect to the proper pads. This process has the limitation of requiring photolithographic techniques to form the new wiring level. Furthermore, additional thin film process steps cannot be done after chips, pins etc, have been attached.

Laser deposition methods are also being developed for repairing circuit opens. As disclosed in U.S. Pat. application Ser. No. 223,487, filed on Jul. 25, 1988, and presently assigned to IBM Corporation, an open circuit is repaired by laser induced electroplating process based on the thermobattery effect. One tip of the open conductor is heated with a laser beam, and a thermobattery is formed between the hot spot (tip of the conductor) and the cold part (normal section of the conductor). The laser heating of the tip induces the conductive material present in the plating solution to be formed at the hot tip. This process is continued until the growth of the conductive material joins the two open ends of the open, and a continuous electrical path is formed.

Another process for interconnecting thin-film electrical circuits is taught in U.S. Pat. No. 4,880,959, and presently assigned to IBM Corporation. Both ends of the existing circuit are partially ablated at the open defect site with pulses from an excimer laser, and then gold metal is deposited by LCVD (laser chemical vapor deposition). This process makes the repairs right after the thin film deposition, and prior to any subsequent module build (i.e. at the substrate level).

Under some circumstances a laser, as disclosed in U.S. Pat. No. 4,572,941 (Sciaky, et al.), could be used to make spot welds. The laser induced melting can cause structural damage to sensitive dielectrics and adjoining lines.

Among other things, this invention describes an "open" repair process after active and passive components have already been attached to the substrate. This can be done by either using a low temperature electrically conductive material or a micro-wire attachment. A micro-wire could include a nugget or a wire jumper, depending on the length of the "open," across the "open," which is attached to the defective line and making it electrically continuous. The attaching of the repair material can be accomplished by using brazing, ultrasonic bonding, lasersonic bonding, thermo-compression bonding or any combination of these methods. Alternatively, the repair could be made by reflowing a low temperature electrically conductive material, such as a micro-solder ball.

The process of this invention allows multiple number of repairs to be accomplished in one step which is another advantage over the other methods.

This process is novel in that it enables the repair of line defects after the module has been built.

SUMMARY AND OBJECTS OF THE INVENTION

The invention is a novel method for repairing thin film line defects at different levels of build without impacting the structural integrity of the package, or the functionality of devices.

One object of this invention is to restore an electronic package to full electrical functionality.

Another object of this invention is to enable repair in a previously continuous electrical conductor which has developed defects during subsequent processing.

Still another object of this invention is to enable repair in the presence of active components such as chips, and passive components such as capacitors, pins, discrete wires, etc.

Another object is to allow repair of thin film lines on top of organic dielectric materials such as polyimides.

Another object of this invention is to allow a "dry" method of performing the repair using ultrasonic attachment of repair material across the defect in the line.

Another object of this invention is to carry out repairs by reflow of a low temperature electrically conductive material, such as solder or braze, in a localized area without melting any portion of the conductor line.

Another object of this invention is to produce a metallurgical bond between the conductor line and the repaired section without melting the conductor line.

Another object of this invention is to fabricate a planar repair structure within the conductor line, which enables subsequent processing to fabricate additional wiring layers etc.

In one aspect the invention comprises a method for forming an electrically conductive path across a defect in an electrical line comprising the steps of, (a) ablating an area around the defect,
(b) placing a segment of an electrically conductive material over at least a portion of the line, and
(c) securing the segment to the line, thereby forming the electrically conductive path.

In another aspect this invention comprises a method for forming an electrically conductive path across a defect in an electrical line comprising the steps of:

(a) ablating a first area at one end of the defect and exposing a first portion of the defective electrical line,
(b) ablating a second area at the second end of the defect and exposing a second portion of the defective electrical line,
(c) placing a segment of an electrically conductive material over at least a portion of the first and the second portions of said defective electrical line, and
(d) metallurgically securing the segment to the first and the second portions of the electrical line, thereby forming the electrically conductive path.

In yet another aspect this invention comprises a repaired substrate comprising a carrier, a conductive line having at least one open on the carrier, an electrically conductive material in at least one of the open to form a continuous electrical path in the conductive line.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1A, illustrates a conductor line having a defect because of a mouse bite.

FIG. 1B, illustrates a conductor line being noncontinuous because of debris lodged in the line path.

FIG. 1C, illustrates a conductor line having a defect due to a flaw in the substrate.

FIG. 1D, illustrates a conductor line being discontinuous as a result of physical damage.

FIG. 1E, illustrates a conductor line having a flaw in the line due to process mishaps.

FIG. 2A, illustrates a substrate after the open has been site-dressed for repairs.

FIG. 2B, illustrates a site-dressed substrate similar to FIG. 2A, where a solder ball is being transferred via a carrier.

FIG. 2C, illustrates a conductor line being repaired after the solder ball of FIG. 2B, has been reflowed.

DETAILED DESCRIPTION OF THE INVENTION

Figure 3:
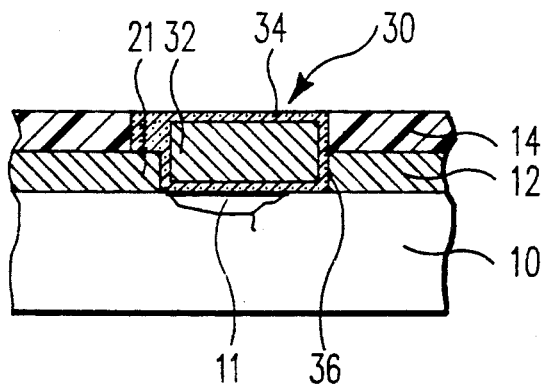
FIG. 3, shows another electrical line repair process according to the teachings of this invention.

This invention describes various methods of repairing opens and near opens and latent defects in electrical conductor lines.

Latent defects include narrow neck or thin portion or other contamination related defects. The term latent defects as used herein, also means a small portion or section of a conductor line which has a higher resistance per unit length than the normal conductor line. The narrow neck can be of a different shape, for example, the narrow neck could be a local reduction in the line width or a local reduction of line height or thickness or a portion of the line may be made of a material with lower conductivity than that of a normal line. The narrow neck could also include a thin electrical connection or a bridge across an open circuit, or a crack which before stressing does not show up as an open.

An open as understood in the art, is any missing conductor across which current cannot flow or is significantly impeded. This typically establishes a resistance threshold above which the electrical conductive path is considered open.

The defects or flaws as discussed in this patent application are primarily in a thin film packaging structure with or without the discrete components being mounted.

Nugget refers to a wire or a segment of an electrically conductive material which is bonded simultaneously to both sides of an open, thereby bridging the gap and forming an electrical path.

Jumper refers to a repair method where a wire is bonded from a good portion of the line, across the defect to another good portion of the line, creating an electrical path.

Thin film is a term currently used by the industry to define lines that are formed on a substrate or a carrier that have a very small dimensions (of the order of a few micrometers). Thin films are so small that they can only be clearly seen using a microscope or similar such device. Therefore, the repairs of such conductive lines with such dimensions is equally difficult.

The method as disclosed by this invention is performed at relatively low temperatures, therefore, this method can be used on substrates with metal/polymer thin film wiring, or other organic materials. It can also be applied to printed circuit boards.

FIGS. 1A through 1E, illustrate the common ways of how a defect is formed in a conductive thin film line. A defect caused by a mouse bite is shown in FIG. 1A. On a carrier 10, an electrically conductive line 12, is formed by any of the methods known in the art, but due to defects smaller than the line dimension, such as process mishaps or contamination, a mouse bite 16, occurs. This mouse bite 16, may not be discovered until after a protective coating 14, has already been applied. In most cases this protective coating 14, is a polyimide layer or some other dielectric or insulator layer. Typically, the electrically conductive material for the thin film line is selected from a group comprising aluminum, antimony, bismuth, chromium, copper, gold, indium, lead, molybdenum, nickel, palladium, platinum, silver, tin, titanium, tungsten, or alloys thereof.

Another reason that a conductor line could be non-continuous is because of debris lodged in the line path. This is illustrated in FIG. 1B, where a debris 18, prevents the line 14, from being continuous. The debris 18, could be a small dust particle, flake, fiber, or residual process material. Similarly, the debris 18, could create a partial or a complete blockage of the electrical path or the open can be a result of debris being dislodged during subsequent processing. If the blockage is partial then this line problem may not surface until later, while a complete blockage would be detected when an electrical test is done.

FIG. 1C, illustrates a conductor line 12, having an open due to a flaw 11, in the carrier 10. This flaw 11, could be small to only create a partial discontinuity, or a large one making the conductor line 12, completely open.

Discontinuities as a result of physical damage of the part is another way to create an open in a conductor line. FIG. 1D, illustrates the electrical conductor line 12, that has had a scratch or a cut or a nick 19, as a result of physical damage, and the scratch 19, has not only damaged the protective coating 14, but has also penetrated through into the carrier 10.

During processing sometimes the electrical conductor line itself has flaws and discontinuities 13, as shown in FIG. 1E. The conductor line 12, that had the break or flaw 13, in the line 12, due to process mishaps may get fully or partially filled with a protective coating 15, that is used to form the protective coating 14, over the conductor line 12.

In each case where an open has been formed, at least a portion of the conductor line 12, must be exposed and prepared by appropriate methods to allow subsequent repair. This is known as site-dressing. In some situations more than one portion of the electrical line 12, will have to be exposed and prepared. In most situations, only a portion of the electrical line 12, that will be used in the repair process needs to be exposed and site-dressed.

Interconnection or repair of thin film circuits can be difficult to make in some instances. For example, the metallurgy in an existing circuit may consist of multiple layers, where the top most layer is a barrier metal, e.g. chromium, that oxidizes and forms a protective, insulating layer. Similarly, the circuit line could have been overcoated with a dielectric material, thus preventing direct access to the site. Before a connection can be made in such circumstances, the protective layer(s) must be removed, and in such a way that a good mechanical and electrical contact can be made between the repair or interconnection metallurgy and the existing circuitry. In the operations required for repair using wire or solder, or combinations thereof, the removal process must also create a surface consistent with the additive process being used, either wettable by solder, or bondable by wire. The removal operation can be readily controlled by adjusting the fluence, wavelength and number of laser pulses or shots used, in order not to damage the conductor line.

In some cases the thin film beneath the polymer, such as polyimide, is a line, which has a metallurgical stack where the top layer is non-bondable to a metal unless a sub-layer is exposed which is more bondable. This sub-layer could be exposed using laser ablation. In this situation the top layer is typically Cr, and once the polyimide or similar insulator coating is removed, Cr gets oxidized, thus preventing the repair. In such circumstances the laser ablation could be used to remove the oxidized Cr layer and exposing a sub-layer, such as Cu, that can be used to carry out the line repair.

One such cleaning of bonding surfaces using a laser is disclosed in, "Laser Ablative Cleaning of Bonding Surfaces," IBM Technical Disclosure Bulletin, Vol. 32, No. 4A, Pages 429–430 (September 1989).

FIG. 2A, illustrates a substrate after the open 24, has been prepared for repairs. As shown, one end 22, of the line 12, has been completely prepared, while the other end 23, of the electrical line 12, has not yet been prepared.

FIG. 2B, illustrates a prepared substrate which is similar to that of FIG. 2A. A micro-solder repair ball or drop 26, which is on a carrier 20, is placed over the opening 24, between the two ends of the electrical conductor 12, and the solder ball is transferred into the opening 24. By applied heating the solder ball 26, separates from the carrier 20, and lodges itself into the opening 24, forming a metallurgical bond with the open ends 21 and 22, of the line 12. As shown, both ends 21 and 22, of the line 12, have been site-dressed.

For open repair using the carrier or decal 20, a low temperature electrically conductive material, such as a solder ball 26, is secured to the carrier 20, by methods well known in the art. For example, the solder ball 26, could be fabricated on a carrier, such as a silicon carrier in the same manner as a normal semiconductor devices. The solder volume for the solder ball 24, is designed to be of sufficient volume to fill the open and make the repair such that the repaired line is planar or near-planar. The solder ball 26, is then placed over the open 24. Flux is also used on the open site to facilitate joining of the solder.

The solder ball 26, is then reflowed by methods well known in the art, and the solder ball after reflow 28, is shown in FIG. 2C. The solder ball after reflow 28, illustrates a conductor line 12, that has been repaired using the solder ball repair technique. Materials other than solder could be used such as, braze, e.g. Au/Sn, or any material that will form a metallurgical bond such a Sn, In, Pb/In, Pb/Sn, Pb/Sn/Ag etc. Other materials that could be used in place of the solder ball 26, could be electrically conductive organometallic material or electrically conductive polymeric material, to name a few.

The low temperature electrically conductive material or solder, could be secured to the line 12, by a method selected from a group comprising hot gas reflow, furnace reflow, thermode or laser reflow, to name a few. Any of these methods can be used for structure that is illustrated in FIG. 2C. In this step the low melting point electrically conductive material, such as solder, bonds during reflow to the electrically conductive line, such as copper, gold, nickel etc., and the open is easily repaired. The normal post join cleaning process, using xylene or other suitable solvents, removes the carrier 20, and the flux (not shown).

Another electrical line repair process according to the teachings of this invention is shown in FIG. 3. The carrier 10, has a flaw 11, that had resulted in an open 24, as discussed elsewhere. The first step after locating the open is to prepare the site for repairs as discussed earlier. As shown, one end 21, of the line 12, has been site-dressed. The second exposed end 36, of the line 12, has been cleaned so that at least a portion of the electrically conductive line 12, is exposed for subsequent metallurgical bonding. An electrically conductive segment or a slug 30, is made using a compatible wire 32, such as a copper wire, and it is coated with a partial or full layer of material 34, that is electrically conductive, such as solder. Other materials such as electrically conductive organometallic material or electrically conductive polymeric material, to name a few, could be used to form the partial or full layer of material 34. The dimension of the slug 30, should be such that it fits snugly into the opening 24. The slug 30, is then heated and the coating material 34, melts and reflows. Upon completion one ends up with a continuous electrical line with a metallurgical bond in the repaired segment. In order to ensure a good electrical and metallurgical bond between the wire 32, and the line 12, at least a portion of the end of wire 32, should have a coating of the material 34.

"Solder Coating Thin Copper Wire," IBM Technical Disclosure Bulletin, Vol. 11, No. 7, Page 876 (December 1968), gives an example of a wire that is coated with solder that could be used with this invention. The slug 30, could be made by cutting the solder coated wire to the appropriate length so that it fits snugly into the opening 24.

Figure 4:
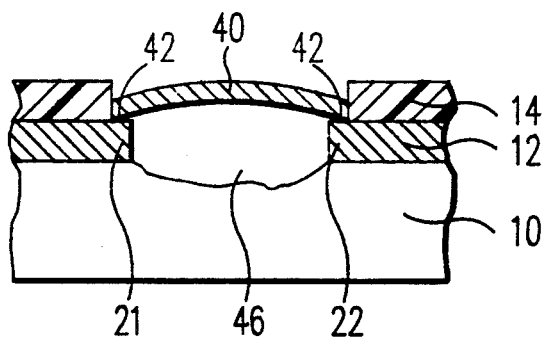
FIG. 4, is another repair method of an electric line according to the teachings of this invention.

Another embodiment of making a repair is shown in FIG. 4. A carrier 10, has a void area 46, and subsequent formation of the line 12, resulted in an open. The upper surface 42, of the two open ends of the electrically conductive line 12, are exposed and prepared as discussed elsewhere, and a nugget or a jumper wire 40, is secured to the ends of the electrical line 12, by any one or more of the method selected from a group comprising ultrasonic bonding, brazing, thermal compression bonding or lasersonic bonding. In order to obtain a good metallurgical bond between the jumper wire 40, and the upper surfaces 42, of the electrical line 12, at least the end of the jumper wire 40, should be coated with a low temperature electrically conductive material, such as solder.

Figure 5:
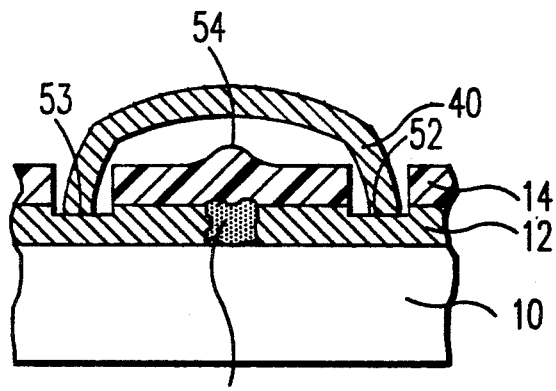
FIG. 5, is still another repair method of an electric line according to the teachings of this invention.

Another way to use a jumper wire to repair an open is illustrated in FIG. 5, where the carrier 10, has a debris 18, lodged that results in a partial or a complete open. If this debris is large enough, it could create a slight bump 54, in the coating layer 14. At different locations in the coating 14, openings are made to expose at least the upper surface 52 and 53, of the line 12. The two ends of the jumper line 40, are then secured to the upper surface 52 and 53, of the line 12, thus creating an electrical path and repairing the open. This method of repairing opens could be used in some situations where there may be more discontinuities in the line and a single repair may not solve the problem. In other cases the location of the open may be such that it does not lend itself to direct repair. In all these cases the method as shown in FIG. 5, would be the way to make the repair. As stated earlier, a good metallurgical bond between the jumper wire 40, and upper surface 52 and 53, of the line 12, may be made by locally reflowing a low temperature electrically conductive material, such as solder, that the end of the line 12, may be coated with.

Figure 6:
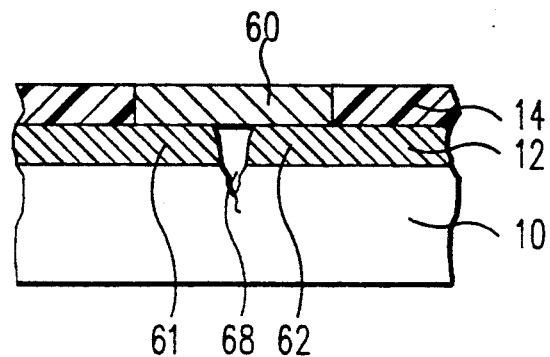
FIG. 6, illustrates yet another repair method of electrical lines according to the teachings of this invention.

FIG. 6, illustrates another repair method of electrical lines according to the teachings of this invention. The carrier 10, and the line 12, both have defect 68, that creates a complete or a partial open. An electrically conductive segment or a slug or a nugget 60, is placed over the open and is secured to the exposed ends 61 and 62, of the electrical line 12, by methods discussed earlier. Of course, the electrically conductive segment 60, could comprise a partial or a complete coating of a low temperature electrically conductive material, such as solder, electrically conductive organometallic material or an electrically conductive polymeric material, to name a few (not shown).

After each of the methods discussed above of repairing a line an additional layer of coating material, such as an insulator or dielectric, could then be applied over the repaired line 12. The insulator that was used was a polyimide. If further processing of the substrate is desired then this additional coating could be planarized by methods well known in the art.

Each of the methods for line repair as disclosed in this invention can be done with active devices, such as chips, or passive devices, such as capacitors, wires or pins, already on the module and without the need to remove them. Of course, the device under which the repair has to be done has to be removed and that device will have to be remounted once the thin film line has been repaired.

The teaching of this invention could also be used for repairing narrow necks and thin portions. The initial repair procedure could be similar to the one that is currently being used in the industry for the repairs of narrow necks and thin portions, which is to pass a very strong current pulse into each conductor line. The narrow necks or thin portions will burn out by the extreme heat generated there and an open will result. The conductor lines are then visually inspected or tested for circuit opens. The open gaps are then cleaned and joined together by any of the methods disclosed here.

EXAMPLES

The following examples are intended to further illustrate the invention and are not intended to limit the scope of the invention in any manner.

EXAMPLE 1

An open thin film circuit consisting of a 14 micron wide, 9 micron thick electrical line or a thin film line on a ceramic carrier overcoated with 8 microns of polyimide was prepared for a wire or a nugget repair. An area 160 micron long, 20 micron wide was laser ablated with 8-10 shots or pulses from an excimer laser operating at 308 nanometers with a fluence of 3.8 Joules per square centimeter to remove the polyimide. The metallurgical line was then further treated with 1-3 pulses of the excimer laser at a reduced aperture (160 micron by 14 micron wide) and at a fluence of 12 Joules per square centimeter. The follow-on treatment removed the upper most oxidized Cr layer from the top of the interdiffused electrical line leaving a bondable surface.

The wavelength was chosen such that the polymer had high absorption and could be cleanly etched. The removal of the polyimide was achieved with pulsed ultraviolet radiation in the range 100-400 nm. The polyimide insulator was removed at laser fluences in the 0.025-40 Joule/square centimeter range. The metallic thin film line were treated with laser fluences in the 0.5-40 Joule/square centimeter range.

The protective polyimide overcoat, approximately 120 microns in length, over the defective part of the line was laser ablated for a single bond. Two 120 micron openings over a good part of the line, on each side of the defect were laser ablated if a jumper wire was to be used.

Pure gold wire with a diameter of 0.7 mils (17.8 microns), matching the width of the thin film line, was secured as a nugget or a jumper wire on/or over the defect using the above mentioned processes. While the bond tip is still in contact with the wire and the thin film line, the long unused segments of wire should be removed.

A severely damaged region of thin film circuit, consisting of a 14 micron wide, 9 micron thick metallurgical thin film line was prepared for a wire jumper. Two bonding zones, 160 micron long and 20 micron wide were prepared at either end of the damaged region using the methods described above, with the polymer overcoat being first laser ablated, and then the exposed metallurgy was treated to produce the bondable surface. The wire jumper was then secured to the existing good line, thus creating a continuous electrical path.

EXAMPLE 2

A defective line that was similar to the one used in Example 1, was repaired using a specially fabricated wire of diameter of 15-20 microns. The size of the wire matched the size of the thin film line. This wire is coated with Pb/Sn solder. Solder composition was selected by the temperature at which no damage to polyimide integrity can occur and also by the ultimate temperature hierarchy of the system. The solder used was 63 percent tin and 37 lead, and the repair process was as follows:

A specially fabricated tip which had a footprint with a contoured surface, such as the shape of the wire, held the wire in place on the line to be repaired. The contoured surface for the tip of the specially fabricated bonding tip could be selected from the group comprising, a flat surface, a triangular surface, a semicircular surface, an elliptical surface, a square surface, a rectangular surface, or a polygonal surface, to name a few. This tip was then heated with a laser which melted the solder in place. Solder bonded to the line by means of a chemical reaction between the solder and the line metallurgy.

EXAMPLE 3

This new process has been developed to repair gold and non-gold lines. The process uses a solder as means of repair. The chosen solder was 97 percent lead and 3 percent tin. This was due to the fact that it is compatible with thermal hierarchy in existence today. This same concept can be used with different solder compositions consistent with the temperature hierarchy of the module or the structure to be repaired.

A near open in a thin film circuit consisting of a 30 micron wide, 6 micron thick metallurgical thin film line on a multi-level polyimide structure overcoated with 4 micron of polyimide was prepared for a solder repair. An area 100 micron long, 80 micron wide was ablated of polyimide with 5-6 pulses from the excimer laser operating at 308 nanometers with a fluence of 3.8 Joules per square centimeter. The exposed metallurgy was then further treated with a single pulse at a fluence of 8 Joules per square centimeter with a slightly reduced aperture size (100 micron by 30 micron). The single pulse completely removed the upper most oxidized Cr layer, producing a clean copper surface ready to accept the solder repair.

Twenty opens were repaired by the same method as discussed above and also in reference to FIGS. 2B and 2C. Repairs were made, measured and compared after one reflow. The substrate was then reflowed ten times to ensure that repairs would withstand device joining. It was noticed that the resistance of the repaired lines did not change. It was also discovered that the resistance of the repaired line is comparable to that of non-defective line of similar geometry.

EXAMPLE 4

The invention can also be used for making repairs on an open line on the module after a devices have been placed. Once it has been determined that there is an open, then the device near the defect site is removed and using laser ablation a window, such as a rectangular window is made through the polyimide or insulator layer and the two ends of the open are exposed. A nugget or a jumper wire or a solder is placed in the rectangular window that lays over the two ends of the open and using appropriate means, the nugget or the jumper wire or the solder is bonded to the open and a "continuous" line is thereafter obtained. The removed device is then put back on the module and the repaired module is then sent for its next operation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for forming an electrically conductive path across a defect in an electrical line comprising the steps of,
   (a) ablating an area around said defect,
   (b) placing a segment of an electrically conductive material over at least a portion of said line, and
   (c) securing said segment to said line, thereby forming said electrically conductive path.

2. The method of claim 1, wherein said electrically conductive material is selected from a group comprising aluminum, antimony, bismuth, chromium, copper, gold, indium, lead, molybdenum, nickel, palladium, platinum, silver, tin, titanium, tungsten, or alloys thereof.

3. The method of claim 1, wherein the upper surface of said line is laser ablated.

4. The method of claim 1, wherein said ablated area around said defect is at least 25 percent larger than the average cross-sectional dimensions of said line.

5. The method of claim 1, wherein said electrical line is in a thin film packaging structure.

6. The method of claim 1, wherein a tip having a contoured surface is used for securing said segment to said line.

7. The method of claim 6, wherein said contoured surface is selected from the group comprising, a flat surface, a triangular surface, a semicircular surface, an elliptical surface, a square surface, a rectangular surface, or a polygonal surface.

8. The method of claim 1, wherein said segment of an electrically conductive material is a low temperature electrically conductive material, and wherein said low temperature electrically conductive material is secured to said line by a method selected from hot gas reflow, furnace reflow, thermode, or laser reflow.

9. The method of claim 1, wherein said segment of an electrically conductive material is solder, and wherein said solder is secured to said line by a method selected from hot gas reflow, furnace reflow, thermode, or laser reflow.

10. The method of claim 1, wherein said repaired defect is covered with an insulator material.

11. The method of claim 1, wherein said repaired defect is covered with a polyimide material.

12. The method of claim 1 wherein said segment of an electrically conductive material is a nugget, and wherein said nugget is secured to said line, by a method selected from a group comprising ultrasonic bonding, brazing, thermal compression bonding, or lasersonic bonding.

13. The method of claim 1, wherein at least a portion of said segment of an electrically conductive material is covered with a low temperature electrically conductive material, and wherein said low temperature electrically conductive material is secured to said line by a method selected from hot gas reflow, furnace reflow, thermode, or laser reflow.

14. The method of claim 1, wherein at least a portion of said segment of an electrically conductive material is covered with solder, and wherein said solder is secured to said line by a method selected from hot gas reflow, furnace reflow, thermode, or laser reflow.

15. The method of claim 14, wherein a metallurgical bond is formed between said segment and said line by melting of said solder.

16. A method for forming an electrically conductive path across a defect in an electrical line comprising the steps of:
 (a) ablating a first area at one end of said defect and exposing a first portion of said defective electrical line,
 (b) ablating a second area at the second end of said defect and exposing a second portion of said defective electrical line,
 (c) placing a segment of an electrically conductive material over at least a portion of said first and said second portions of said defective electrical line, and
 (d) metallurgically securing said segment to said first and said second portions of said electrical line, thereby forming said electrically conductive path.

17. The method of claim 16, wherein said electrically conductive material is selected from a group comprising aluminum, antimony, bismuth, chromium, copper, gold, indium, lead, molybdenum, nickel, palladium, platinum, silver, tin, titanium, tungsten, or alloys thereof.

18. The method of claim 16, wherein the upper surface of said line is laser ablated.

19. The method of claim 16, wherein at least said first area and said second area around said defect are laser ablated.

20. The method of claim 16, wherein said ablated area around said first area and said second area is at least 25 percent larger than the average cross-sectional dimensions of said defective electrical line.

21. The method of claim 16, wherein at least one of the upper surfaces of said line is laser ablated.

22. The method of claim 16, wherein a tip having a contoured surface is used for securing at least one end of said segment to said defective electrical line.

23. The method of claim 22, wherein said contoured surface is selected from the group comprising, a flat surface, a triangular surface, a semicircular surface, an elliptical surface, a square surface, a rectangular surface, or a polygonal surface.

24. The method of claim 16, wherein at least one of said repaired defect is covered with an insulator material.

25. The method of claim 16, wherein at least one of said repaired defect is covered with a polyimide material.

26. The method of claim 16, wherein at least a portion of said segment of electrically conductive material is covered with a low temperature electrically conductive material.

27. The method of claim 16, wherein at least a portion of said segment of electrically conductive material is covered with solder.

28. The method of claim 27, wherein said segment having at least a portion covered with solder is secured to said defective electrical line, by a method selected from a group comprising hot gas reflow, furnace reflow, thermode, or laser reflow.

29. The method of claim 28, wherein a metallurgical bond is formed between said segment and said line by melting of said solder.

30. The method of claim 16, wherein at least one end of said segment of electrically conductive material is secured to said defective electrical line by a method selected from a group comprising ultrasonic bonding, brazing, thermal compression bonding, or lasersonic bonding.

31. The method of claim 1, wherein said electrically conductive material is an electrically conductive organometallic material.

32. The method of claim 1, wherein said electrically conductive material is an electrically conductive polymeric material.

33. The method of claim 1, wherein at least one end said segment has a coating of a low temperature electrically conductive material.

34. The method of claim 16, wherein said electrically conductive material is an electrically conductive organometallic material.

35. The method of claim 16, wherein said electrically conductive material is an electrically conductive polymeric material.

36. The method of claim 16, wherein at least one end of said segment has a coating of a low temperature electrically conductive material.

37. The method of claim 1, wherein said defective electrical line is a thin-film line.

38. The method of claim 16, wherein said defective electrical line is a thin-film line.

39. The method of claim 1, wherein said segment of electrically conductive material is transferred on to said line from a decal.

40. The method of claim 39, wherein the material for said decal is silicon.

41. The method of claim 39, wherein the material for said electrically conductive material is selected from a group consisting of solder, braze, electrically conductive organometallic material or electrically conductive polymeric material.

42. The method of claim 16, wherein said segment of electrically conductive material is transferred on to said line from a decal.

43. The method of claim 42, wherein the material for said decal is silicon.

44. The method of claim 42, wherein the material for said electrically conductive material is selected from a group consisting of solder, braze, electrically conductive organometallic material or electrically conductive polymeric material.

* * * * *